United States Patent
Watanabe

(10) Patent No.: US 7,750,361 B2
(45) Date of Patent: Jul. 6, 2010

(54) SURFACE MOUNT LIGHT EMITTING APPARATUS

(75) Inventor: Seishi Watanabe, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 12/187,597

(22) Filed: Aug. 7, 2008

(65) Prior Publication Data
US 2009/0065796 A1 Mar. 12, 2009

(30) Foreign Application Priority Data
Aug. 10, 2007 (JP) ............................. 2007-209973

(51) Int. Cl.
*H01L 33/00* (2010.01)
(52) U.S. Cl. .................. 257/99; 257/100; 257/E33.057; 257/E33.058; 257/E33.059; 257/E33.065
(58) Field of Classification Search .................. 257/99, 257/100, E33.057, E33.058, E33.059, E33.065
See application file for complete search history.

(56) References Cited

U.S. PATENT DOCUMENTS

| 6,970,489 | B2 * | 11/2005 | Shimonaka | 372/43.01 |
| 7,230,259 | B2 * | 6/2007 | Inoue et al. | 250/551 |
| 2003/0168720 | A1 * | 9/2003 | Kamada | 257/666 |
| 2004/0065894 | A1 * | 4/2004 | Hashimoto et al. | 257/100 |
| 2005/0023441 | A1 * | 2/2005 | Inoue et al. | 250/214.1 |
| 2005/0151231 | A1 * | 7/2005 | Yoshida | 257/669 |
| 2005/0280017 | A1 * | 12/2005 | Oshio et al. | 257/99 |
| 2006/0151799 | A1 | 7/2006 | Watanabe et al. | |
| 2006/0220048 | A1 * | 10/2006 | Matsumoto et al. | 257/98 |
| 2007/0090381 | A1 * | 4/2007 | Otsuka et al. | 257/98 |
| 2007/0108436 | A1 * | 5/2007 | Sanmyo | 257/13 |
| 2007/0284605 | A1 * | 12/2007 | Chen et al. | 257/99 |
| 2008/0023721 | A1 * | 1/2008 | Lee et al. | 257/99 |

FOREIGN PATENT DOCUMENTS

JP 2006190888 7/2006

* cited by examiner

*Primary Examiner*—Ngan Ngo
(74) *Attorney, Agent, or Firm*—Kenealy Vaidya LLP

(57) ABSTRACT

A surface mount LED apparatus is provided which can prevent separation of the surface of an LED chip from a sealing resin portion. Patterned circuits on a substrate are provided with a device mounting region and a wire bond region, and an increased-thickness portion having a thickness 1.6 times or more than the greater of the thickness of the device mounting region and the thickness of the wire bond region. When the apparatus is heated, this configuration allows for inducing interfacial separation between the increased-thickness portion and the sealing resin portion earlier than interfacial separation is induced between the LED chip and the sealing resin portion. This configuration can prevent interfacial separation between the LED chip and the sealing resin portion.

2 Claims, 1 Drawing Sheet

SURFACE MOUNT LIGHT EMITTING APPARATUS

This application claims the priority benefit under 35 U.S.C. §119 of Japanese Patent Application No. 2007-209973 filed on Aug. 10, 2007, which is hereby incorporated in its entirety by reference.

BACKGROUND

1. Technical Field

The presently disclosed subject matter relates to a surface mount light emitting apparatus, and in particular, to a surface mount LED apparatus in which an LED chip mounted on a substrate is sealed with a resin material.

2. Description of the Related Art

A surface mount LED apparatus, such as one disclosed in Japanese Patent Application Laid-Open No. 2006-190888 (corresponding to U.S. Patent Publication No. 2006/0151799A1), has a pair of patterned circuits which are formed from the top surface of the substrate to the bottom surface via the respective side surfaces of the substrate. An LED chip is mounted on the top surface of the substrate. The LED chip has a bottom electrode which is electrically connected to one of the pair of patterned circuits via an electrically conductive adhesive or the like. The LED chip also has a top electrode which is electrically connected to the other of the patterned circuits by wire bonding or the like. The LED chip, together with the bonding wire and part of the patterned circuits, is sealed with a resin material which is transparent to the wavelength of emitted light.

Such a surface mount LED apparatus can be mounted on a component substrate together with other electronic components. For this purpose, reflow soldering is typically employed. During reflow soldering, the entire assembly is heated to a high temperature, such that the difference in thermal expansion coefficient between the sealing resin material of the surface mount LED apparatus and the patterned circuits typically causes thermal stress on the interface between the patterned circuits and the sealing resin material. This thermal stress may in turn act to lift the LED chip above the patterned circuits, thereby causing the LED chip to be separated from the patterned circuits resulting in faulty electrical continuity therebetween.

To prevent this electrical discontinuity, a technique described in Japanese Patent Application Laid-Open No. 2006-190888 is employed in which a portion underneath the LED chip has no patterned circuit formed thereon, so that an insulating substance which constitutes the substrate is exposed. Mounting the LED chip on the patterned circuits provides a gap corresponding to the height of the patterned circuits between the exposed insulating substance and the bottom surface of the LED chip, so that the sealing resin goes into this gap to bring the substrate and the sealing resin into tight contact therebetween. The adhesion between the sealing resin material and the insulating substance (the substrate) is greater than that between the resin material and the metal material (forming the patterned circuits). This prevents the LED chip from being separated from the patterned circuits even in the presence of thermal stress, which is caused by heating during reflow soldering, between the sealing resin material and the patterned circuit.

Although the technique described in Japanese Patent Application Laid-Open No. 2006-190888 provides an improvement in the adhesion between the LED chip and the substrate, the thermal stress during reflow soldering is also produced on the interface between the sealing resin material and the LED chip. This may lead to interfacial separation by which the sealing resin material and the LED chip are separated from the interface therebetween.

An occurrence of separation between the sealing resin material and the LED chip on the interface therebetween would result in a microscopic void appearing at the separated portion, thereby causing deterioration in the intensity of light emitted from the LED chip. Since the LED chip is typically cubic in shape, the stress on the interface between the chip and the surrounding resin material tends to concentrate on its corner, thereby causing separation from the corner. Once separation occurs at a particular portion, the adhesion of that portion is reduced thereby causing the stress to be relieved at the separated portion and the area of separation then can expand.

SUMMARY

The presently disclosed subject matter was devised in view of these and other problems, features, characteristics, and in association with the conventional art. According to an aspect of the presently disclosed subject matter, a surface mount light emitting apparatus such as a surface mount LED apparatus can prevent separation on the surface of the LED chip.

According to another aspect of the presently disclosed subject matter, a surface mount light emitting apparatus can include: a substrate; a pair of patterned circuits formed on the substrate; a light emitting device mounted on one of the patterned circuits; and a sealing resin portion configured to seal the light emitting device. One of the pair of patterned circuits includes a device mounting region configured to mount the light emitting device, and the other includes a wire bond region which is wire-bonded to the light emitting device. The pair of patterned circuits is provided with an increased-thickness portion which is greater in thickness by a predetermined scaling factor than the device mounting region and the wire bond region. When the apparatus is heated, this configuration makes it possible to induce interfacial separation between the increased-thickness portion and the sealing resin portion earlier than interfacial separation is induced between the light emitting device and the sealing resin portion. It is thus possible to relieve stress of the sealing resin portion, thereby preventing interfacial separation between the light emitting device and the sealing resin portion.

In this configuration, the predetermined scaling factor can be 1.6 times or more, and possibly 2.0 times or more.

The aforementioned increased-thickness portion can have an outer shape with a corner. This allows for concentrating stress due to thermal expansion on a corner of the increased-thickness portion, thereby facilitating the separation of the sealing resin portion to prevent the interfacial separation between the light emitting device and the resin portion.

The increased-thickness portion can be set to a thickness greater than or equal to the thickness or height of the light emitting device, for example. Furthermore, the increased-thickness portion can be provided on the other patterned circuit where no device mounting region is provided.

According to still another aspect of the presently disclosed subject matter, a surface mount light emitting apparatus can include: a substrate; a pair of patterned circuits formed on the substrate; a light emitting device mounted on one of the patterned circuits; and a sealing resin portion configured to seal the light emitting device. One of the pair of patterned circuits includes a device mounting region configured to mount the light emitting device, and the other includes a wire bond region which is wire-bonded to the light emitting device. The substrate is provided thereon with a separation-inducing structure configured to induce an interfacial separation prior to an interfacial separation being induced between the light emitting device and the resin portion. The separation-inducing structure can be made of a material having a thermal expansion coefficient substantially the same as that of the light emitting device, and can have a height greater than the light emitting device. The material can be a semiconductor material. The sum of the top and side areas of the separation-inducing structure can be greater than the sum of the top and side areas of the light emitting device. When the apparatus is heated, this configuration makes it possible to induce interfacial separation between the separation-inducing structure and the sealing resin portion earlier than interfacial separation is induced between the light emitting device and the sealing resin portion. It is thus possible to prevent interfacial separation between the light emitting device and the sealing resin portion.

According to the presently disclosed subject matter, when the light emitting apparatus is heated during reflow soldering, interfacial separation between the increased-thickness portion (or separation-inducing structure) and the sealing resin portion can be induced earlier than interfacial separation occurs between the light emitting device and the sealing resin portion. It is thus possible to prevent interfacial separation between the light emitting device and the sealing resin portion. This in turn can prevent deterioration in the intensity of light emitted from the light emitting device.

BRIEF DESCRIPTION OF THE DRAWINGS

These and other characteristics, features, and advantages of the presently disclosed subject matter will become clear from the following description with reference to the accompanying drawings, wherein.

DETAILED DESCRIPTION OF EXEMPLARY EMBODIMENTS

A description will now be made below to surface mount light emitting apparatuses, or surface mount LED apparatuses, of the presently disclosed subject matter with reference to the accompanying drawings in accordance with exemplary embodiments.

First Exemplary Embodiment

Figure 1:
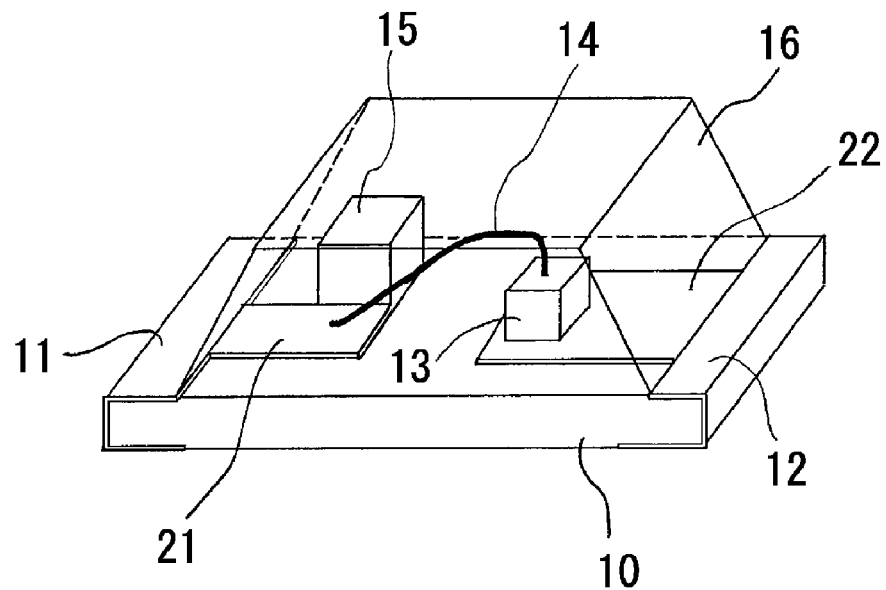
FIG. 1 is a perspective view illustrating the configuration of a surface mount LED apparatus of a first exemplary embodiment made in accordance with principles of the presently disclosed subject matter.

With reference to FIG. 1, a description will be made to the structure of a surface mount LED apparatus of the first exemplary embodiment. In FIG. 1, to distinctively illustrate the shape of those elements disposed within sealing resin portion 16, the outer shapes of the elements inside the resin portion 16 are illustrated with a solid line.

As shown in FIG. 1, the surface mount LED apparatus can include a substrate 10, a pair of patterned circuits 11 and 12 disposed on the upper surface of the substrate 10, and an LED chip 13. One of the patterned circuits 12 can include a chip mounting region 22 on the upper surface of the substrate 10, with the LED chip 13 mounted on the chip mounting region 22. On the upper surface of the substrate 10, the other of the patterned circuits 11 can include a bonded region 21 and an increased-thickness metal layer portion 15 which is thicker than other portions, for example thicker in a light emitting direction of the LED than the thickness of the LED chip in the light emitting direction. The configuration and effect of the increased-thickness metal layer portion 15 will be described later in more detail. The patterned circuits 11 and 12 can be designed such that they are formed not only on the upper surface of the substrate 10 but also on its bottom surface via its respective side surfaces of the substrate 10, so that power can be fed to the patterned circuits 11 and 12 on the bottom surface of the substrate 10.

The LED chip 13 can be cubic in shape, and although not illustrated, can have a bottom electrode and a top electrode. The bottom electrode can be adhered to the chip mounting region 22 of the patterned circuit 12 using, for example, an electrically conductive adhesive for electrical connection. One end of a bonding wire 14 can be bonded to the top electrode. The other end of the bonding wire 14 is then bonded to the bonded region 21 of the patterned circuit 11.

The upper surface of the substrate 10 can be sealed with the sealing resin portion 16 as illustrated. The sealing resin portion 16 can cover the LED chip 13, the bonding wire 14, the bonded region 21 of the patterned circuit 11, and the chip mounting region 22 of the patterned circuit 12. The sealing resin portion 16 employed can be transparent to light emitted from the LED chip 13 and resistant to high temperature (for example, approximately 250 degrees Centigrade) which is reached during reflow soldering. Materials for the sealing resin portion 16 to be employed can be specifically thermosetting resin materials, photocurable resin materials, low-melting glass materials, combinations thereof, and the like. In particular, thermosetting resin materials such as epoxy resins, silicone resins, polydimethyl siloxane derivatives having an epoxy group, oxetane resins, acrylic resins, cycloolefin resins, and the like can be employed. These resin materials can be used singly or as a mixture of two or more.

The patterned circuits 11 and 12 can be formed of any metal material that is typically used for patterned circuits for use in LED apparatuses. The patterned circuits 11 and 12 may have a single-layer structure or multi-layer structure.

Figure 2:
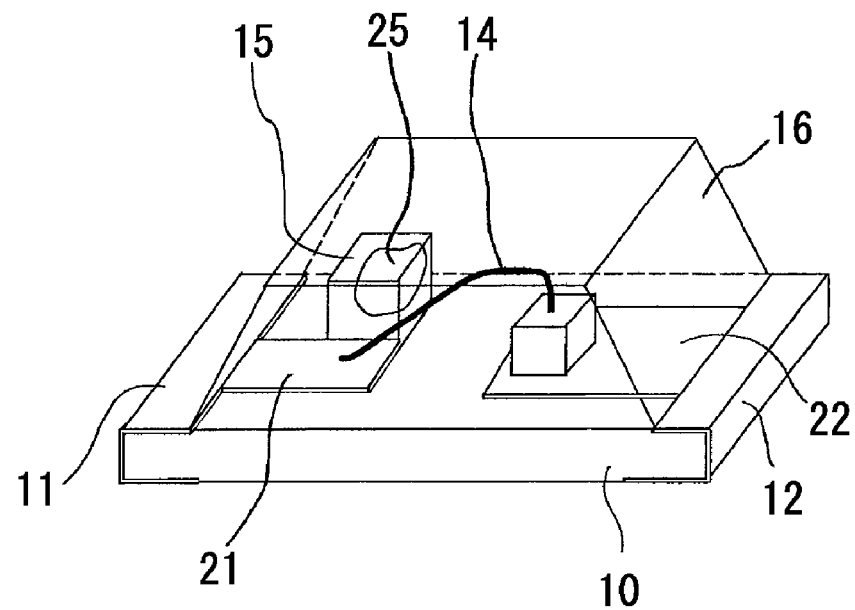
FIG. 2 is a perspective view illustrating the surface mount LED assembly of FIG. 1 in which interfacial separation 25 has occurred when heated.

Interfacial separation between the LED chip 13 and the sealing resin portion 16 may occur during reflow soldering due to the difference in thermal expansion coefficient between the LED chip 13 and the sealing resin portion 16. The present exemplary embodiment employs the increased-thickness metal layer portion 15 as a structure configured to induce interfacial separation before such separation occurs on the LED chip 13, in order to prevent the interfacial separation between the LED chip 13 and the sealing resin portion 16 from occurring. More specifically, as shown in FIG. 1, one portion of the patterned circuit 11 can be formed to be thicker than the other portion, thereby providing the one portion to serve as the increased-thickness metal layer portion 15. The increased-thickness metal layer portion 15 can be formed of a metal material, and therefore the difference in thermal expansion coefficient between the portion 15 and the sealing resin portion 16 is greater than that between the resin portion 16 and the semiconductor material that forms the LED chip 13. Accordingly, the strain that is induced at the interface between the increased-thickness metal layer portion 15 and the sealing resin portion 16 when heated will be greater than the stress between the LED chip 13 and the sealing resin 16. As shown in FIG. 2, it is thus possible to produce an interfacial separation portion 25 on the increased-thickness metal layer portion 15 before interfacial separation occurs on the LED chip 13.

Note also that in FIG. 2, to distinctively illustrate the shape of those elements disposed within the sealing resin portion 16, the outer shapes of the elements inside the resin portion 16 are illustrated with a solid line.

During reflow soldering, interfacial separation may occur on the increased-thickness metal layer portion 15 before it occurs on the LED chip 13. In this case, the stress of the sealing resin portion 16 due to thermal expansion is relieved through the interfacial separation portion 25, so that no separation occurs on the LED chip 13, or even if it does happen, the separation can be suppressed to such an insignificant extent that it would not affect the optical characteristics (such as the intensity) of the LED.

The increased-thickness metal layer portion 15 may be located away from the LED chip 13 inside the sealing resin portion 16, for example, near the periphery of the sealing resin portion 16. The reason for selecting this location is so that an optical change in the interfacial separation portion 25 resulting from the interfacial separation induced at the interface between the increased-thickness metal layer portion 15 and the sealing resin portion 16 does not affect the light emitted from the LED chip 13.

To provide increased expansive stress to be induced between the increased-thickness metal layer portion 15 and the sealing resin portion 16, the metal layer portion 15 can be shaped to have a height (thickness) that is enough to prevent the expansion of the sealing resin portion 16. The metal layer portion 15 can have a thickness at least greater than the greater of the thickness of the chip mounting region 22 and the bonded region 21. More specifically, as described later, the thickness of the metal layer portion 15 can be 1.6 times or more than the thickness of the chip mounting region 22 and/or the bonded region 21 (whichever is thicker), and possibly 2.0 times or more than the greater of the thicknesses. In particular, the metal layer portion 15 can have a height that is greater than the height of the LED chip 13. The height being measured in the light emitting direction of the LED and from a bottom most portion of the measured object in the light emitting direction to a topmost portion of the measured object in the light emitting direction.

Furthermore, to allow expansive stress to concentrate on one point and thereby easily induce separation, the increased-thickness metal layer portion 15 can be shaped to have a corner, such as being formed as a cube.

The increased-thickness metal layer portion 15 may be formed of single-layered film or multi-layered film, so that it can employ a layer structure and can be formed by a depositing method typically used to form the patterned circuit 11. For example, the metal layer portion 15 can be deposited by plating. When the multi-layered film structure is employed, one or more of the film layers can be made thicker only at the increased-thickness metal layer portion 15, thereby allowing for forming the other portions of the patterned circuit 11 at the same time as the increased-thickness metal layer portion 15 is formed. For example, the increased-thickness metal layer portion 15 can be provided with a film thicker than the other portions by covering the other portions with a resist during deposition.

Example

An experiment was carried out to examine how much thicker the increased-thickness metal layer portion 15 should be than the chip mounting region 22 and/or the bonded region 21 to allow for inducing interfacial separation at the metal layer portion 15 prior to separation occurring in the LED chip 13.

The structure of FIG. 1 was employed as the surface mount LED apparatus. The patterned circuits 11 and 12 were formed of a stack of metal layers of Au/Ni/Cu with Au layer on top. The sealing resin portion 16 employed was formed of an epoxy resin material. The chip mounting region 22 had a thickness of 50 μm, and the bonded region 21 had a thickness of 50 μm. Three samples were prepared which had the increased-thickness metal layer portion 15 of a thickness 1.5 times (75 μm), 1.6 times (80 μm), and twice (100 μm) the thickness (50 μm) of the chip mounting region 22 and the bonded region 21, respectively. Then, the sealing resin portion 16 of the samples was allowed to absorb a certain amount of moisture under the same humidity environment and heated to a predetermined temperature (260 degrees Centigrade) for observation of whether separation was induced on the LED chip 13. The results are shown in the following Table 1.

TABLE 1

| | Thickness of the increased-thickness metal layer portion 15 (Ratio of the portion 15 to the other portion) | Results |
|---|---|---|
| Sample 1 | 75 μm (1.5 times) | B |
| Sample 2 | 80 μm (1.6 times) | A |
| Sample 3 | 100 μm (2.0 times) | AA |

Notes:
B: Separation occurred on the LED chip 13 (Degradation in intensity was found when compared to the sample ranked "AA")
A: At the same intensity level during emission as that of the sample having no separation (ranked "AA"). Some separation was found on the LED chip 13.
AA: No separation was found on the LED chip 13.

As is clear from Table 1, it was confirmed that interfacial separation between the LED chip 13 and the sealing resin portion 16 could be prevented by creating the increased-thickness metal layer portion 15 and providing it with an increased thickness. Note that in Table 1, all the samples 1, 2, and 3 had interfacial separation induced between the increased-thickness metal layer portion 15 and the sealing resin portion 16.

Then, the samples 1, 2, and 3 were gradually heated to temperatures until interfacial separation occurred between the LED chip 13 and the sealing resin portion 16 to thereby examine their separation initiation temperatures. The results obtained show that the sample 1 (75 μm), the sample 2 (80 μm), and the sample 3 (100 μm) had increasing separation initiation temperatures in that order. This made it possible to conclude that the thicker the increased-thickness metal layer portion 15, the higher the separation initiation temperature became.

From the results as shown above, it was found that a deterioration in intensity due to interfacial separation on the LED chip 13 can be prevented when the increased-thickness metal layer portion 15 has a thickness 1.6 times or more than the thickness of the chip mounting region 22 and/or the bonded region 21. It was also found that a thickness 2 times or more prevents interfacial separation on the LED chip 13 in a further manner.

As described above, according to the present exemplary embodiment, a simple structure provided with the increased-thickness metal layer portion 15 that is part of the patterned circuit 11 and increased in thickness can be used to prevent interfacial separation between the LED chip 13 and the sealing resin portion 16 during reflow soldering. This makes it possible to prevent deterioration in intensity of the LED and thereby provide a high-performance surface mount LED apparatus.

Second Exemplary Embodiment

Instead of the increased-thickness metal layer portion 15 of the first exemplary embodiment, the surface mount LED apparatus of a second exemplary embodiment is provided with a semiconductor dummy structure as the separation-inducing structure configured to induce interfacial separation before it occurs between the LED chip 13 and the sealing resin portion 16. The semiconductor dummy structure can be located at the same position as the increased-thickness metal layer portion 15 in the first exemplary embodiment. Note that the semiconductor dummy structure can be configure to have substantially the same thermal expansion coefficient as that of the LED chip 13 which is also formed of a semiconductor material. Accordingly, in the present exemplary embodiment, the semiconductor dummy structure should be greater in height than the LED chip 13 in order to ensure separation between the resin 16 and the dummy structure before separation of the resin 16 and the LED chip 13. The sum of the top and side areas of the semiconductor dummy structure can also be greater than that of the LED chip 13 to ensure early separation as described above.

As such, a semiconductor dummy structure that is increased in height can act to more effectively hinder the expansion of the sealing resin portion 16 than the LED chip 13, and is thus subjected to interfacial separation earlier than the LED chip 13 even if the dummy structure and the LED chip 13 have almost the same thermal expansion coefficient. This allows the interfacial separation portion induced on the dummy structure to alleviate the expansive stress of the sealing resin portion 16, thereby making it possible to prevent interfacial separation on the LED chip 13.

For example, it is possible to use an LED chip as the semiconductor dummy structure.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A surface mount light emitting apparatus comprising:
    a substrate;
    a pair of patterned circuits formed on the substrate;
    a light emitting device mounted on one of the patterned circuits; and
    a sealing resin portion configured to seal the light emitting device, wherein
    one of the pair of patterned circuits includes a device mounting region configured to mount the light emitting device, and an other of the pair of patterned circuits includes a wire bond region which is wire-bonded to the light emitting device,
    the substrate is provided with a separation-inducing structure configured to induce an interfacial separation between the resin portion and the separation-inducing structure prior to an interfacial separation being induced between the light emitting device and the resin portion,
    the separation-inducing structure is made of a material having a thermal expansion coefficient substantially the same as a thermal expansion coefficient of the light emitting device, and the separation-inducing structure has a height greater than a height of the light emitting device taken in a main light emitting direction of the light emitting apparatus substantially normal to the substrate.

2. The surface mount light emitting apparatus according to claim 1, wherein a sum of top and side areas of the separation-inducing structure is greater than a sum of top and side areas of the light emitting device.

* * * * *